United States Patent
Sayyah et al.

(10) Patent No.: US 8,615,028 B1
(45) Date of Patent: Dec. 24, 2013

(54) VERTICALLY INTEGRATED OPTICAL PHASED ARRAY WITH PSEUDO-RANDOM ARRAY ARCHITECTURE

(75) Inventors: Keyvan Sayyah, Santa Monica, CA (US); James H. Scaffner, Chatsworth, CA (US); Carson R. White, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 356 days.

(21) Appl. No.: 12/902,657

(22) Filed: Oct. 12, 2010

(51) Int. Cl.
*H01S 5/00* (2006.01)

(52) U.S. Cl.
USPC ............ 372/50.123; 372/50.1; 372/50.12; 372/50.124; 372/50.21

(58) Field of Classification Search
USPC ......... 372/50.1, 50.12, 50.123, 50.124, 50.21
See application file for complete search history.

(56) References Cited

U.S. PATENT DOCUMENTS

| | | | | |
|---|---|---|---|---|
| 4,649,351 | A * | 3/1987 | Veldkamp et al. | 359/349 |
| 5,568,574 | A * | 10/1996 | Tanguay et al. | 385/14 |
| 2003/0103534 | A1* | 6/2003 | Braiman et al. | 372/10 |
| 2004/0066808 | A1* | 4/2004 | Trezza | 372/26 |
| 2011/0052114 | A1* | 3/2011 | Bernasconi et al. | 385/3 |

OTHER PUBLICATIONS

A.C. Lehman et. al., Applied Physics Letters, vol. 88 (2006) p. 021102.
F. Vasey et. al., Applied Optics, vol. 32 (1993) p. 3220.
Jean-Francois Seurin et. al., Proc. Of SPIE, vol. 6908 (2008).
P.F. McManamon et. al., Proceedings of IEEE, vol. 84, No. 2 (1996) p. 268.
R.H. Yan et. al., IEEE J. Quant. Electron., vol. 25, No. 11(1989).

* cited by examiner

*Primary Examiner* — Yuanda Zhang
(74) *Attorney, Agent, or Firm* — Ladas & Parry

(57) ABSTRACT

A vertically integrated optical phased array has an array of a plurality of vertical cavity surface emitting lasers disposed in an aperiodic arrangement thereof, the plurality of vertical cavity surface emitting lasers having light emitting ports disposed parallel to one another. An array of a plurality of vertical cavity phase modulators disposed in the same aperiodic arrangement as the array of the plurality of vertical cavity surface emitting lasers, with individual modulators of said array of a plurality of vertical cavity phase modulators each being disposed in optical alignment with an injection port of a corresponding one of said plurality of vertical cavity surface emitting lasers. An array of a plurality of laser ports, fed by a master laser, are disposed in the same aperiodic arrangement as the array of the plurality of vertical cavity surface emitting lasers, the master laser providing, in use, injection beamlets, each injection beamlet, in use, injection locking a corresponding one of said plurality of vertical cavity surface emitting lasers via a corresponding one of said plurality of vertical cavity phase modulators.

28 Claims, 7 Drawing Sheets

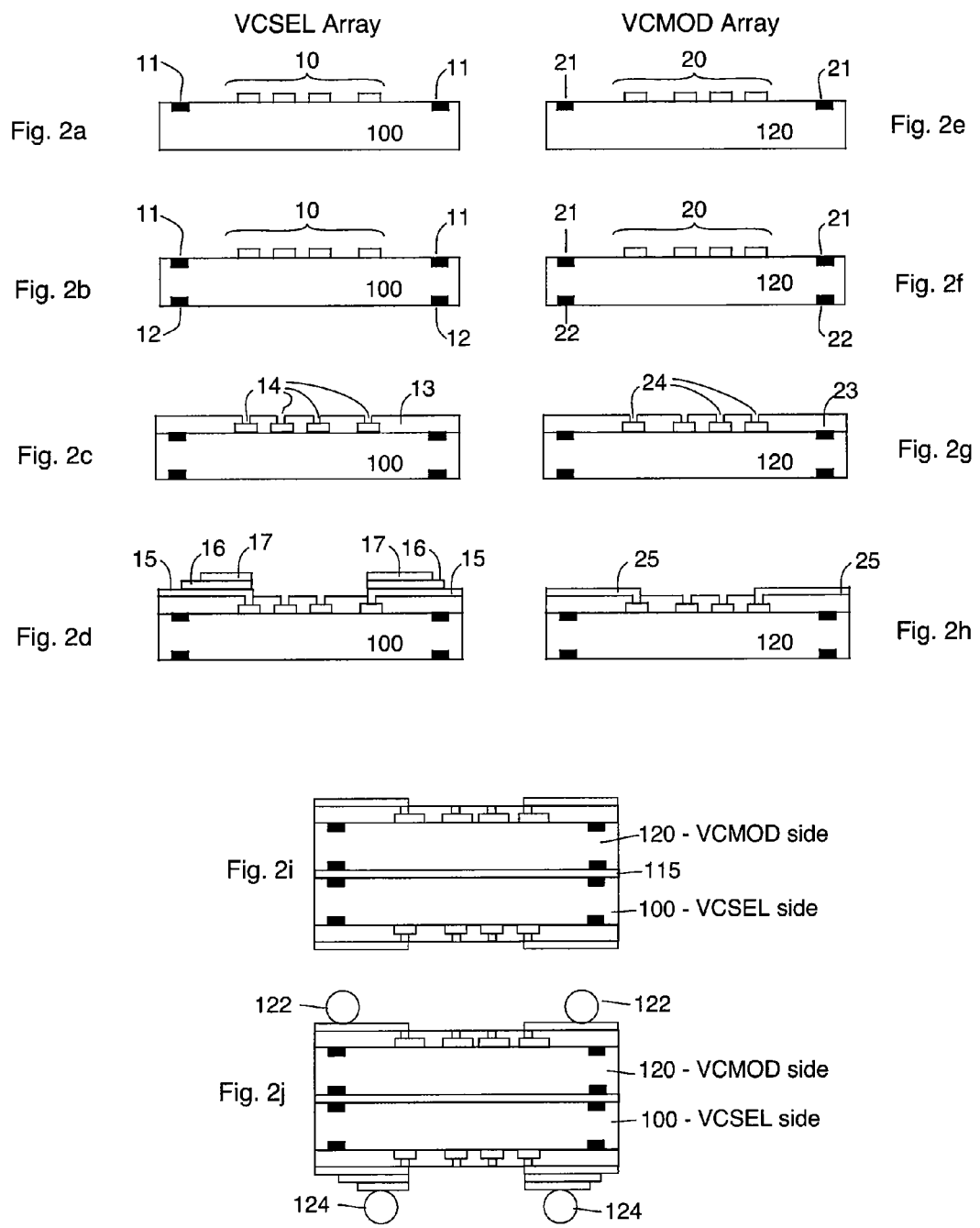

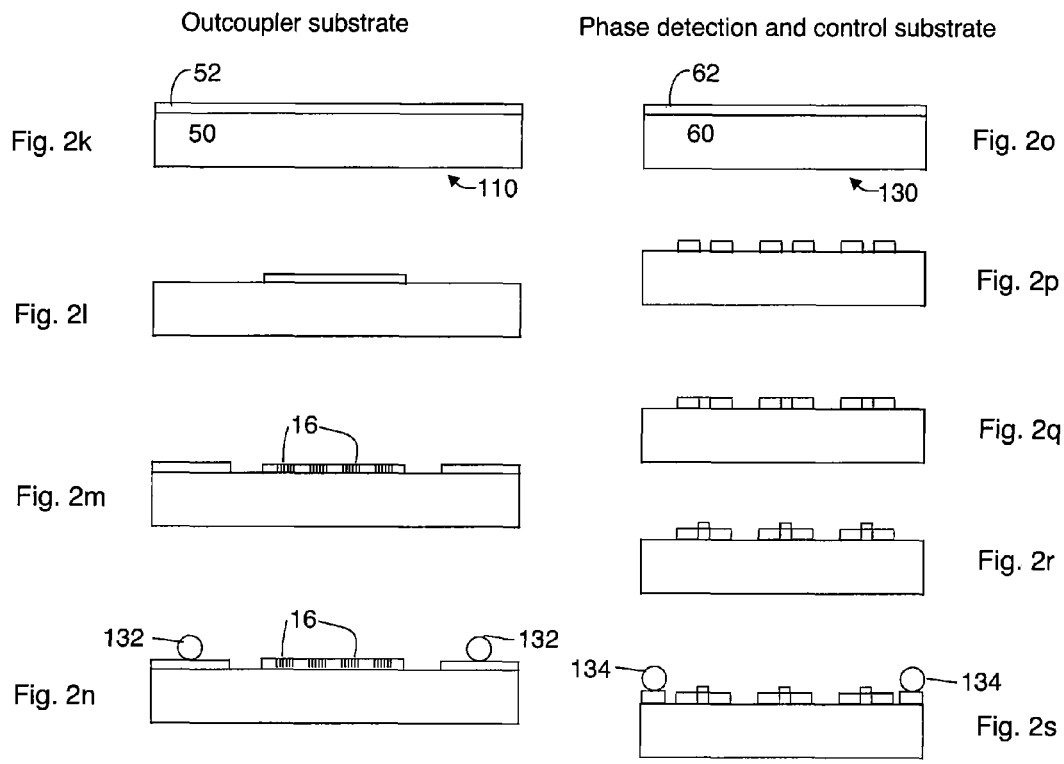

VERTICALLY INTEGRATED OPTICAL PHASED ARRAY WITH PSEUDO-RANDOM ARRAY ARCHITECTURE

CROSS REFERENCE TO RELATED APPLICATIONS

None

TECHNICAL FIELD

This invention relates to a chip-scale optical phased array (OPA) device, based on vertical integration of a 2-D aperiodic array of pseudo-randomly placed (p-random) vertical cavity surface emitting lasers (VCSEL), with a corresponding 2-D array of coherent phase modulating optical injection beams.

BACKGROUND

Optical phased array (OPA) device are known in the prior art, but they have grating lobes in their output beams.

The presence of grating lobes is one of the main issues with prior art optical phased arrays due to the difficulty of fabricating arrays with spacings less than wavelength. This problem is overcome by the present invention. The present invention provides additional benefits, including a narrow beamwidth of the output beam together with high beam position accuracy.

The prior art includes a liquid crystal-based optical phased array (LC-OPA) which consists of a liquid crystal (LC) cell with one-dimensional patterned transparent conductor strips in which each strip defines an element of the linear array. For beam steering in two dimensions, two such LC cells are arranged in orthogonal orientations. LC-OPA is a fairly mature technology with very low power consumption due to the capacitive nature of the liquid crystal. However, the main issue with the LC-OPA is its slow steering speed (10's of ms range) which is due to the slow response time of the LC-based phase shifting elements. Another disadvantage of liquid crystals is their limited temperature range of operation. At low temperatures (<20° C.) the LC response time significantly degrades due to its increased viscosity, while at higher temperatures (>50° C.) it becomes isotropic and hence loses its functionality. See P. F. McManamon et. al., Proceedings of IEEE, Vol. 40, No. 2 (1996) p. 268.

Another prior art optical beam steering approach is based on the use of integrated semiconductor waveguide arrays in which each array element is a tunable phase shifter. The phase tuning is achieved via the linear electro-optic effect in the material. The main problem with this approach is that it is mainly a 1-D phased array. 2-D beam steering can be achieved by placing tunable waveguide gratings at the end of the phase shifters, but scanning in the elevation direction would be very limited (<1°). In principle, one can envision an in-plane 2-D array of optical phase shifters coupled to an out-coupling grating structure for 2-D beam steering. However, this would become a very complicated structure to realize since it is difficult to route $N^2$ in-plane phase shifted beams to a 2-D array of $N^2$ vertically emitting elements on the same substrate. See F. Vasey et. al., Applied Optics, Vol. 32 (1993) p. 3220.

The approach which is arguably closest to the V-OPA device disclosed here that has been investigated is based on self-locking of a VCSEL array using evanescent coupling between adjacent VCSELs, and varying the injection current of individual VCSELs for phase shifting. See, A. C. Lehman et. al., Applied Physics Letters, Vol. 88 (2006) p. 021102. The problem with this approach is that strong phase locking occurs only among nearest neighbors. This can lead to mode hopping and instabilities for VCSEL arrays with large numbers (>10) of elements. Varying the drive current of each VCSEL with respect to others in the array can result in some phase shifting. However, the level of phase tuning of evanescently coupled VCSELs with drive current has been shown to be less than $\pi/2$, insufficient for a high performance phased array. Furthermore, current tuning of VCSEL phase results in its amplitude variation as well.

BRIEF DESCRIPTION OF THE INVENTION

In one aspect the present invention provides a vertically integrated optical phased array comprising: an array of a plurality of vertical cavity surface emitting lasers disposed in an arrangement thereof, the plurality of vertical cavity surface emitting lasers having light emitting ports disposed parallel to one another; an array of a plurality of vertical cavity phase modulators disposed in the same arrangement as the array of the plurality of vertical cavity surface emitting lasers, with individual modulators of said array of a plurality of vertical cavity phase modulators each being disposed in optical alignment with an injection port of a corresponding one of said plurality of vertical cavity surface emitting lasers; a master laser, an array of a plurality of gratings optically coupled to the master laser, the plurality of gratings being disposed in the same arrangement as the array of the plurality of vertical cavity phase modulators, and each grating of the plurality of gratings optically being aligned with a corresponding one of said plurality of vertical cavity phase modulators; and an array of grating taps disposed in the same arrangement as the array of the plurality of vertical cavity surface emitting lasers, the grating taps being coupled to 10 interferometers for adjusting phase changes imposed by said plurality of vertical cavity phase modulators.

In another aspect this invention provides method of forming reducing grating lobes in an optical phased array, the method including: providing a plurality of vertical cavity surface emitting lasers; providing a plurality of vertical cavity phase modulators, with individual modulators of said plurality of vertical cavity phase modulators each being disposed in optical alignment with an injection port of a corresponding one of said plurality of vertical cavity surface emitting lasers; providing a master laser; providing a plurality of gratings optically coupled to the master laser, the plurality of gratings being disposed in the same arrangement as the array of the plurality of vertical cavity phase modulators, and each grating of the plurality of gratings optically aligned with a corresponding one of said plurality of vertical cavity phase modulators; and providing an array of grating taps disposed in the same aperiodic arrangement as the array of the plurality of vertical cavity surface emitting lasers, the grating taps being coupled to IQ interferometers for adjusting phase changes imposed by said plurality of vertical cavity phase modulators.

BRIEF DESCRIPTION OF THE DRAWINGS

FIGS. 2a-2t depict steps which may be utilized in making the V-OPA of FIG. 1.

DETAILED DESCRIPTION

The key features of the prior art optical phased arrays and the novel V-OPA device disclosed herein are compared in the Table below.

| OPA Technology | V-OPA | Self-Locked VCSELs | LC-OPA | Waveguide OPA |
|---|---|---|---|---|
| OPA Dimension | 2 | 2 | 2 | 1 |
| Beam Scanning Speed | <1 ns | <1 ns | >10 ms | <1 ns |
| Phase shift per element | 2π | <π/2 | <2π | 2π (cm long WG) |
| Grating Lobes | No | Yes | Yes | Yes |
| Mode hopping | No | Yes | N/A | No |
| Indep. phase/amp control | Yes | No | No | Yes |

Overview of the V-OPA Device and the Manufacture of Same

Figure 1:
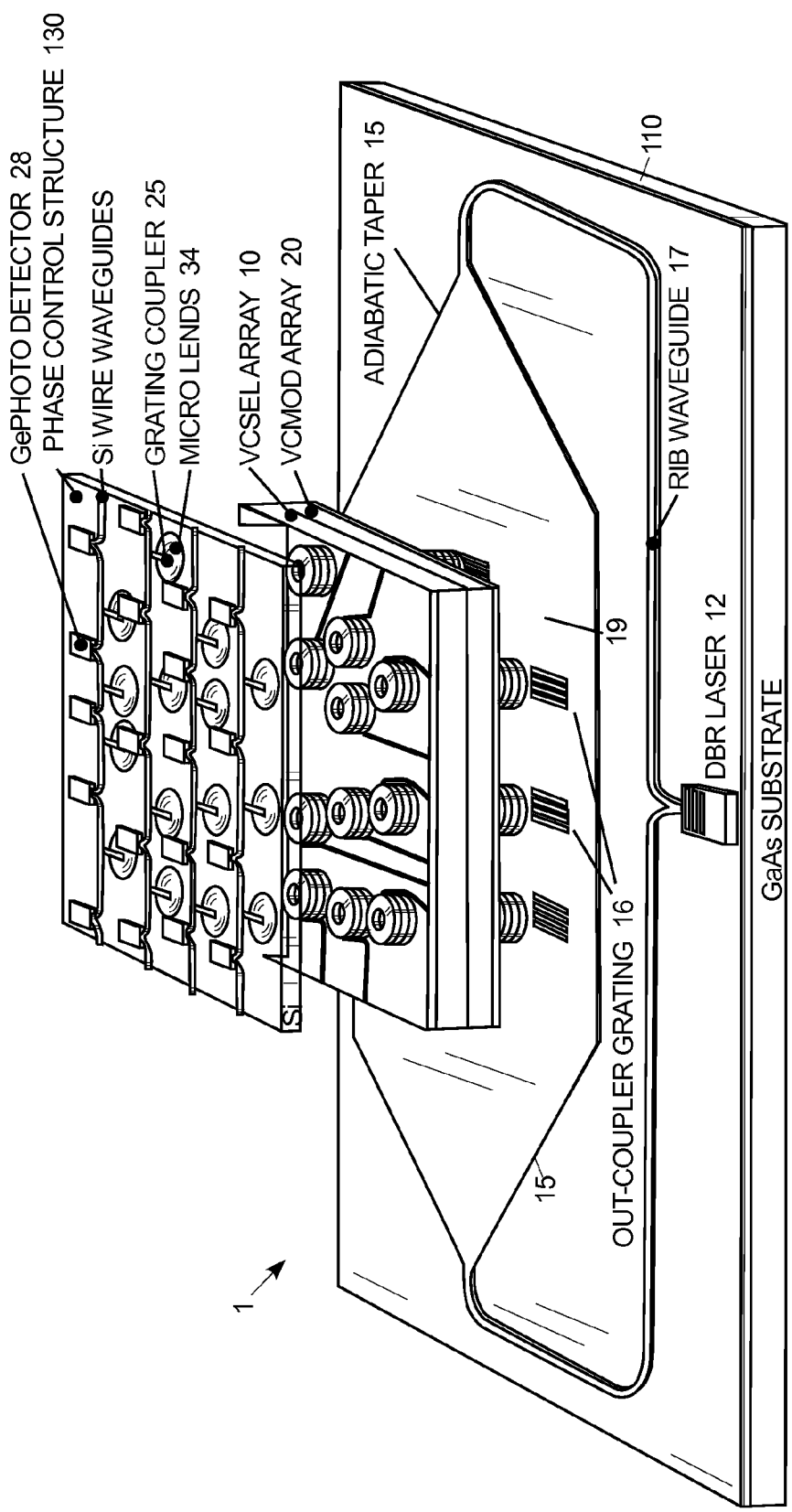
FIG. 1 is a schematic view of a preferred embodiment of the vertically integrated optical phased array (V-OPA) of the present invention—the various device layers are intentionally displaced in the vertical direction for better visualization of their structure.

A schematic diagram of a preferred embodiment the V-OPA device 1 is shown in FIG. 1 as a perspective view thereof. The various device layers are intentionally displaced in the vertical direction for better visualization of their structure The V-OPA device 1 of the present invention is proposed to preferably consist of four main functional layers:

(1) A 2-D array of vertical cavity surface emitting lasers (VCSELs) 10, preferably with a wall-plug efficiency of >40%, for generating emitting optical beamlets 18 of the phased array (see FIG. 2s). The VCSELs 10 are preferably formed in a substrate 100 also shown in FIG. 2a, for example, as is described below. Further, as is explained below in greater detail, the individual VCSELs 10 in substrate 100 are aperiodic or, more preferably, randomly distributed using a predetermined random pattern. The VCSELs 10 in substrate 100 align with certain optical elements in the other layers, so the same aperiodic or predetermined random pattern is used for those elements as well. The adoption of an aperiodic or randomized pattern for the VSCELs 10 and the other optical elements in the other layers should inhibit the formation of grating lobes when the V-OPA device 1 is utilized as an optical phased array. Substrate 100 may comprise GaAs, but other materials may be utilized as well.

(2) A master laser 12 and a preferably 2-D array of gratings 16, that provide ports for out-coupling the laser radiation of the master laser 12 in a vertical direction, forming the 2-D array of coherent beamlets 18 which, in use, injection lock the lasers of the VCSELs 10. The master laser 12 is preferably a DBR laser and the ports may be implemented by gratings 16, all of which may be disposed on or in an outcoupler substrate 100 shown, for example, in FIG. 2k which is described in greater detail below. The gratings 16 in the substrate 100 optically align with the lasers of the VCSEL array 10 and therefore are disposed in the same aperiodic or randomized pattern as selected for the array of VCSELs 10. The gratings 16 are optically coupled with the master DBR laser 12 by a plurality of waveguides 17 defined in the outcoupler substrate 110, along with the master DBR laser 12 and the aforementioned 2-D array of gratings 16. The waveguides 17 feed a slab waveguide region 19 via an adiabatic taper 15. Substrate 110 may comprise GaAs, but other materials may be utilized as well.

(3) A 2-D array of vertical cavity phase modulators (VC-MODs) 20, positioned in between substrate 110 which supports the array of gratings 16 and the array of VCSELs 10, provide independent 0-2π phase shifts for each emitting VCSEL element 10. The VCMODs 20 are preferably formed on a substrate 120 shown, for example, in FIG. 2e which is described in greater detail below. The VCMODs in substrate 120 optically align with the lasers of the VCSEL array 10 and with the gratings 16 in substrate 1010 and therefore are disposed in the same aperiodic or randomized pattern as used for the array of VCSELs 10. Substrate 120 may comprise GaAs, but other materials may be utilized as well.

(4) Finally, a phase control substrate 130 (see also FIG. 3) is preferably included which has of a corresponding integrated array of grating taps 25. Preferably silicon-on-insulator (SOI) wire waveguides 26 and photodetectors 28 (preferably having active regions formed of Ge), together with the grating taps 25, detect the phase shift of each VCSEL 10 and provide feedback for any potential corrections need due to drift, for example. The phase control substrate 130 preferably includes an array of microlenses 34 which preferably increase the amount by which the beams 5 emerging from the VSCEL 10 substrate 110 are bent. The grating taps 25 and the microlenses 34 optically align with the lasers of the VCSEL array 10, with the VCMODs 20 and with the gratings 16 in the outcoupler substrate 100. Substrate 130 may comprise SOI, but other materials may be utilized as well. Beams 5 shown in FIG. 2t are a near field representation and those skilled in the art appreciate the fact that in the far field beams 5 would combine to form one or more independently steered narrow width beams.

Laser beamlets 18 are emitted from outcoupler substrate 110 as an array of beamlets 18 (with the same predetermined aperiodic or randomized pattern mentioned above) in a vertical direction towards the array of VCMODs 20 which impose a variable phase change to each beamlet. The amount of phase change at each VCMOD 20 is initially calibrated using an external fiber-based interferometric measurement system. Each beamlet 18 then exits its associated VCMOD 20 in substrate 120 and enters a corresponding VCSEL 10 to injection lock it. The VCSELs 10 emit a corresponding beam 5 which form an array of beams (with the same predetermined aperiodic or randomized pattern mentioned above), again in a vertical direction, towards the phase control substrate 130. The grating couplers 25 in the phase control substrate 130 are arranged in the same predetermined aperiodic or randomized pattern mentioned above to sample a corresponding portion of the light emitted as beams 5 as will be discussed in greater detail below. The beams 5 exit the phase control substrate 130 and as a steered beam exiting an optical phased array.

The VCSELs 10 are preferably formed in substrate 100 shown in FIG. 2a by techniques know in the art. See Jean-Francois Seurin et. al., Proc. of SPIE, Vol. 6908 (2008), 690808, the disclosure of which is hereby incorporated herein by reference, for information regarding VCSELs and how they may be made. The VCSELs 10, when viewed in a plan view orientation, are randomly arranged as mentioned above. The randomness is controlled a bit as there is a minimum spacing of ~10-20 µm which should be observed between the centers of neighboring VCSELs 10 in substrate 100 and preferably a maximum spacing no greater than the maximin dimension of the physical array in which they will be placed. The minimum spacing is selected to keep the VCSELs 10 from intersecting one another. The maximum spacing is selected so that the VCSELs 10 occur within the physical boundaries of V-OPA device 1 to be made. For a device with 8000 elements the size is about 2×2 mm. When the VCSELs 10 are formed, alignment keys 11, which may be formed as pads of metal or etched structures in the substrate, are preferably formed on the surface of substrate 100.

The VCMODs 20 are preferably formed in substrate 120 shown in FIG. 2e also by techniques know in the art. See R. H. Yan et. al., IEEE J. Quant. Electron., Vol. 25, No. 11 (1989), p. 2272, the disclosure of which is hereby incorporated herein by reference, for information regarding VCMODs and how they may be made. The VCMODs 20, when viewed in a plan view orientation, are also randomly arranged, but as a mirror image of the randomness of the VCSELs 10 in substrate 100 so that the array of randomly-placed VCMODs 20 in substrate 120 will properly align with the array of randomly-placed VCSELs 10 in substrate 100 when the two substrates are placed essentially back to back later in the fabrication process (see FIG. 2t). When the VCMODs 10 are formed, alignment keys 21, which may be formed as pads of metal or etched structures in the substrate, are formed on the surface of substrate 120.

Using alignment equipment the front-side alignment keys 11 are transferred the backside of substrate 100 as back-side alignment keys 12 as shown in FIG. 2b. Additionally, the front-side alignment keys 21 are transferred the backside of substrate 120 as back-side alignment keys 22 as shown in FIG. 2f. Alignment equipment preferably having an alignment capability of ≤1 µm to utilized to transfer the front-side alignment keys 11 as back-side alignment keys 12.

Next, the arrays of VCSELs 10 and VCMODs 20 on substrates 100 and 120 are preferably planarized using dielectric layers 13 and 23 as shown in FIGS. 2c and 2g with openings or vias 14 and 24 formed in the dielectric layers 13 and 23 at the edges of the VCSELs 10 and VCMODs 20, as the case may be. Metalization 15 and 25 is then formed on the substrates 100 and 120 as shown in FIGS. 2d and 2h. Each VCMOD 20 receives, in use, a voltage to control the phase of the associated beamlet 18 used the inject a corresponding VCSEL 10. The voltage supplied to each VCMOD 20 is referenced to ground and each VCMOD 20 has a control connection provided by metalization 15. Each VCSEL 10 receives, in use, a voltage, that adjusts its intensity (CW or pulsed), as needed, as well as to adjust its emission wavelength to within the locking bandwidth of the injection locking beamlet 18. Layers 16 and 17 in FIG. 2d are dielectric and metalization, respectively, and are used later in the fabrication process (see FIG. 2t).

Although only one array of VCSELs 10 is shown in substrate 100 and only one array of VCMODs 20 is shown formed in substrate 120, preferably, during manufacture, large numbers of these arrays 10,20 are formed in their respective substrates 100 and 120 at one time so each substrate supports a plurality of arrays of VCSELs 10 or VCMODs 20. Then one of the substrates 100 and 120 is preferably diced to release the individual arrays formed therein from one another into the individual arrays depicted in FIGS. 2a-2s. These individual (diced) arrays are then preferably bonded to a corresponding arrays on a non-diced substrate. So, if the arrays of VCSELs 10 are diced into individual arrays, then they are to be bonded to the arrays of VCMODs 20 arranged as a sheet of arrays in substrate 120. Otherwise, if the arrays of VCMODs 20 are diced into individual arrays, then they are to be bonded to the arrays of VCSELs 10 arranged as a sheet of arrays in substrate 100. Either way, this technique should permit the diced arrays to be die bonded to the non-diced arrays with submicron alignment and bonding accuracy. The arrays are preferably bonded together as shown in 2t. In FIG. 2t, only two arrays are shown as being bonded together for ease of illustration and explanation, it being understood that one of the two arrays would preferably be undiced and therefore would consist of a large number of arrays on a unitary substrate. A conductive adhesive bond 115 is preferably used for to bond the two substrates, but other bonding techniques may be possibly the used, such as a Au-to-Au thermo-compressive bond. In either case, the bonding technique should not interfere with the beamlets 18. Of course, both substrates 100 and 120 could be diced initially and then the individual diced pieces bonded together to form the module shown in FIG. 2t.

Following the bonding step of the VCSEL and VCMOD arrays 10 and 20, indium (In) bumps 122 are preferably patterned on the VCMOD side of the composite as shown in FIG. 2j, as well as on the opposite side or VCSEL side of the structure as bumps 124.

The outcoupler substrate 110 is prepared for bonding to the composite structure shown by FIG. 2j as shown in FIGS. 2k-2n. The outcoupler substrate 110 may be made as is now described. First, an epitaxial layer 52 (such as GaAs) is deposited on a supporting substrate 50 (such as GaAs) as shown by FIG. 2k. Next, the epitaxial layer 52 is etched (by conventional dry or wet-etching techniques) to form strip waveguides 17 and the adiabatic taper 15 feeding the slab waveguide region 19. See FIG. 1 for a 3-D view and FIG. 21 for a side elevational view. Next, the outcoupling gratings 16 are etched into the slab waveguide 19. Finally, the contact bumps 132 (such as indium) are formed as shown in FIG. 2n on the periphery of the injection locking structure 110 for subsequent attachment to the VCSEL/VCMOD composite layers.

Indium (In) bumps 132 are preferably patterned on the injection locking structure of FIG. 2m as shown in FIG. 2n. An In-to-In bond will allow connection to pads or bumps 134 on the injection locking substrate to bond with pumps or pads 120 on the VCMOD side of the structure shown in FIG. 2j.

The function of the injection locking structure 130 is to provide vertically propagating optical beamlets 18 (See FIG. 2t) for locking all the individual VCSELs 10 to the same master laser frequency of laser 12. These beamlets emanate preferably from a single master laser 12 (or multiple master lasers all locked to a single feeding laser), either integrated on-chip as shown or provided external to the chip. The optical beam of the master laser 12 is preferably coupled to two optical waveguides 17 formed in this structure from two sides using a waveguide splitter 13 (see FIG. 1). The light beam propagating through these waveguides 17 is then expanded to a slab waveguide mode in waveguide 19 using adiabatic tapers 15 on each end of the slab 19. A two-dimensional array of gratings 16 are arranged coincident with the 2-dimensional arrays of VCMODs 20 and VCSELs 10. The gratings 16 in the slab waveguide region 19 outcouple the expanded optical mode in the vertical direction with high efficiency (>90%).

Making the phase control layer substrate 130 shown and described with reference to not only FIG. 1, but also FIGS. 2o-2s, which demonstrate how the phase control structure might be fabricated. In FIG. 2o, a layer of deposited semiconductor 62 on a substrate 60 (preferably silicon-on-insulator (SOI)) is first obtained. Next, an array of high index contrast optical waveguides 26 (such as Si photonic wire waveguides) is defined in this layer as shown in FIG. 2p. This is followed by the formation of a light absorbing layer 28-1 (such as Ge) in areas between the ends of these waveguides to construct the light sensitive regions of an array of photodiodes 28 (see FIG. 2q). Next, a metallization layer is formed on the array of photodiode 28 and routed to the edge of the chip for external connection (see FIG. 2r).

The phase control layer substrate 130 is prepared for bonding to the VCSEL side of the composite structure shown by FIG. 2j also using the In-to-In bonding technique. The VCMODs 20 and outcoupling gratings 30 should be slightly larger in diameter (~6 μm) than the VCSELs (~4 μm) to accommodate a ≤1 μm alignment tolerance during vertical integration.

The resulting structure after preforming the In to In bonding is depicted in the side elevational view of FIG. 2t. The vertically-integrated V-OPA 1 need only occupy a volume of <0.1 cm³: 1×1 cm² in area (as seen in a plan view) and 1 mm total thickness (as seen in the side elevation view). The V-OPA 1 can be made smaller or larger as needed.

The Phase Detection and Control Structure

Figure 3:
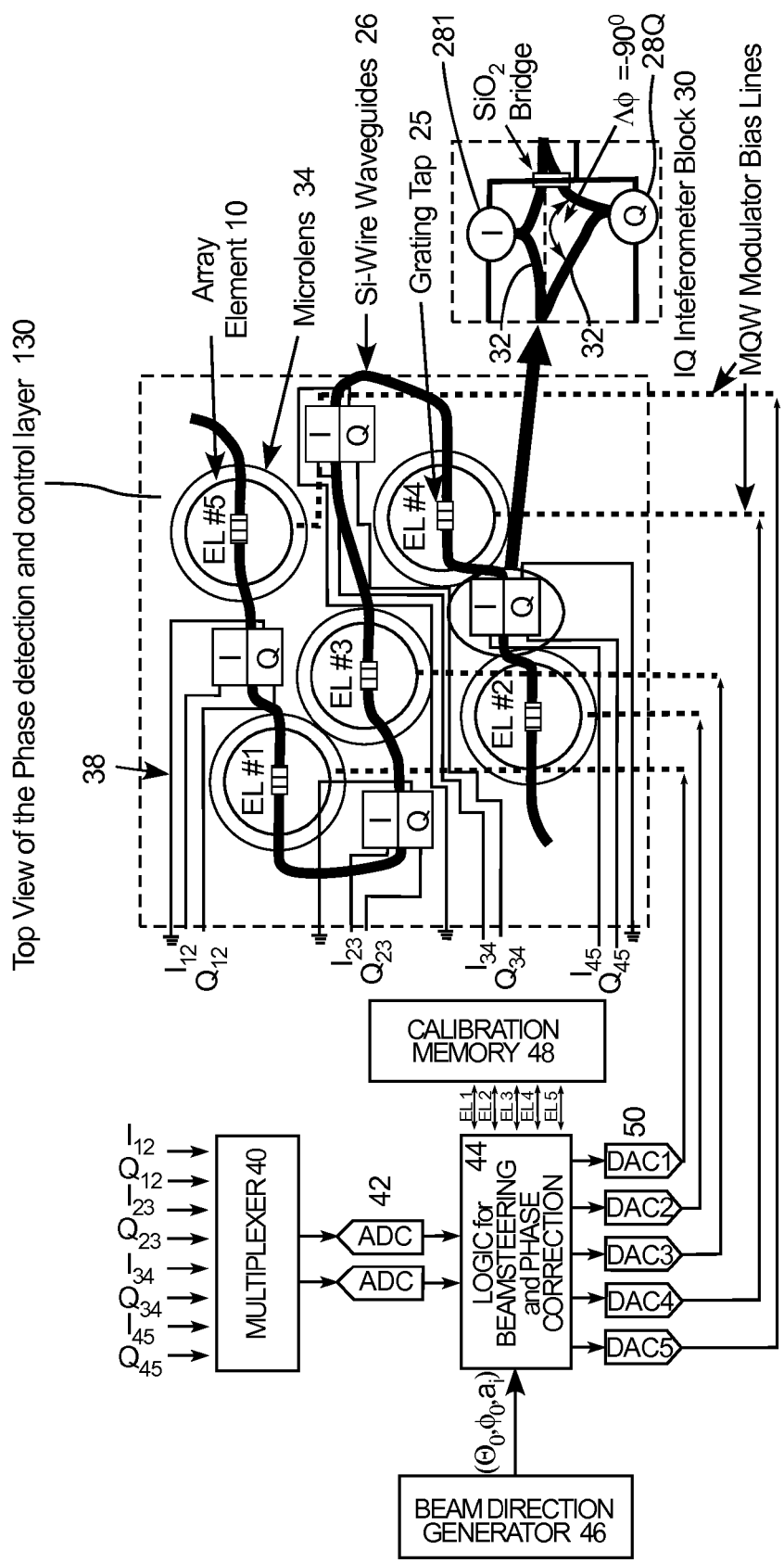
FIG. 3 is a block diagram of an exemplary phase detection and control structure.

The phase of each VCSEL 10 of the vertically integrated optical phased array (V-OPA) can be set by applying a voltage to the corresponding VCMOD 20 (φ-V curve). The preferred phase control strategy is two-fold: (1) calibrate the φ-V curve for each VCSEL 10, and (2) detect and correct any potential deviations from the calibrated φ-V curves using the integrated closed loop phase control structure of FIG. 3. The optical and electrical circuitry of FIG. 3 is preferably implemented on substrate 130. An array of only five VCSELs 10 are depicted (in substrate 100), for ease of illustration, it being understood, of course, that practical embodiments may well have as many as 8000 VCSELs 10, if not more, and a corresponding number of grating taps 25 and microlenses 34 which optically interface with (i) a corresponding number of VCSELs 10 in substrate 100, (i) a corresponding number of VCMODs 20 in substrate 130, and the corresponding number of gratings 16 in outcoupler substrate 130.

The array of VCSELs 10, the array of VCMODs 20, the array of grating taps 25 and the array of microlenses 34 all occur in the same aperiodic or randomized pattern as discussed earlier.

A calibrated fiber optic I/Q phase detector is proposed which has independent I and Q interferometers (formed by photodetectors 28I and 28Q), to calibrate the phase of each array element with respect to a reference element, either another VCSEL, or one of the gratings of the outcoupler substrate 110. Using the fiber-based phase detector, we propose to measure the phase difference between the $i^{th}$ element and the reference element, $\Delta\phi_{i0}=\Delta\phi_i-\Delta\phi_0$, as a function of the $i^{th}$ VCMOD voltage and record it in a look-up table stored, for example, in computer memory.

Although the V-OPA may be disposed, in use, on a Thermo-Electric Cooler (TEC), stringent beam pointing metrics may well require real-time phase control to avoid beam pointing drift. This can be accomplished, preferably, by implementing an integrated silicon-on-insulator (SOI) based phase control structure 130, as shown in FIG. 3. In this structure, a small Si photonic wire grating tap 25 located above each VCSEL 10 taps off a fraction (10%, for example) of the radiated optical signal and couples it into a waveguide 26, preferably, a silicon wire waveguide (SWG) 26. SWGs 26 form a pair of photonic wire gratings 25 are combined and fed into an on-chip interferometric I/Q phase detector 30, which preferably will comprise two pairs of interferometer arms 32 that have nominal phase differences of 0° and 90°. The optical signals in the I and the Q channels of each interferometer 30 are detected by on-chip photodetectors 28I and 28Q, which are preferably made using Ge, as shown in the I/Q channel detail of FIG. 3. The on-chip I/Q phase detector 30 can be calibrated at the same time as the array calibration of the VCMODs 20 is done using the fiber I/Q detector. The currents from Ge photodetectors 28I and 28Q are recorded as part of the look-up table for each element.

The outputs of the photodetectors on lines 38 are preferably applied, in use, to a multiplexer 40, whose outputs are preferably coupled via ADCs 42 to a logic for beamsteering and phase detection 44. Logic 44 preferably receives commands for the azimuth and height of the beam 5 as well as its amplitude from a beam direction generator 46.

During array operation, the voltage of each VCMOD 20 (and hence its phase) to point the beam 19 in a particular direction, is found from a look-up table formed by calibration memory 28. The currents read from the Ge detectors 28I and 28Q associated with each interferometric I/Q phase detector between each photodetector pair are multiplexed into the phase control circuit where the phase differences between all of the elements and the reference element are determined from the look-up table of memory 28. The phase error between the measured phase difference and the desired phase difference is used to adjust the voltage of each VCMOD 20 via a processor, for example, in logic 44, and DACs 50. Any potential errors of the measured phase between each element and the reference due to multiple pair errors is mitigated by extracting the average phase difference between each element and the reference emitter via multiple paths along the array.

The phase control structure 130 has three key advantages: (1) it can ultimately be integrated (including the processors) into a low-cost Si chip, (2) the array of negative (concave) microlenses 34, needed for the required FOV, can be fabricated into the outward side of the same SOI chip, and (3) it can monitor the locking status of each VCSEL 10 and adjust the VCSEL current to maintain its lock to the master laser frequency of laser 12 at all times.

A phased array with a uniform periodicity has grating lobes at angles $\theta_{gl}$ determined by $\sin(\theta_{gl})-\sin(\theta_o)=n\lambda/d$, where, $\theta_o$ is the scan angle, d is the array spacing, $\lambda$ is the wavelength, and n is an integer. Optical phased arrays with uniform spacings suffer from the presence of grating lobes in the output beam since it is extremely difficult to fabricate array spacings less than a wavelength in the optical domain. For example, a uniform 64×64 element phased array with an output beamwidth of less than 0.5° requires array spacings of ~1.6λ (d~1.8 μm for 1.1 μm wavelength). Not only is this small array spacing extremely difficult to implement, but it also results in small emitting apertures, and, hence, low output optical power per emitting facet. Increasing the array spacing will result in closer spacing of the grating lobes, and hence the presence of more lobes in the field-of-view.

In the present V-OPA device 1 elements, the VCSELs 10 and the VCMODs 20 as well as their corresponding gratings 16 and grating taps 25 and are placed in optimized pesudo-random positions, with a minimum spacing of, for example, ~10 to 20 μm. The randomness is "optimized" since, as stated earlier, the VCSELs 10 and the VCMODs 20 as well as their corresponding gratings 16 and grating taps 25 must be spaced slightly apart laterally, yet remain, so far as is possible, in optical alignment with each other. The resulting device should not suffer from grating lobes. This is because when a phased array is non-periodic, grating lobes do not occur, and if the array elements are placed at random locations, the far-field radiation from each element sums in phase only in the main beam direction. The intensity in the main beam varies as N², and the average sidelobe level is 1/N, where N is the number of array elements. For an exemplary 4096-element (64×64) array, the average sidelobe level is about 36 dB, and the peak sidelobe level about −26 dB. Increasing the number of array elements to 8000 reduces the peak sidelobe level to below 30 dB. This increase in the number of array elements results in a very small increase in the complexity and cost of the V-OPA 1.

Figure 4:
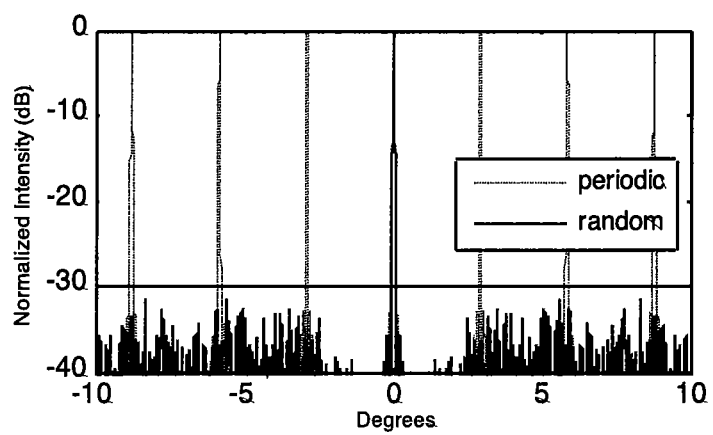
FIG. 4 depicts grating lobes appear in the Field of View (FOV) of a periodic array in contrast to a pseudo-random array, both with 8000-elements—the periodic array exhibits amplitude taper, while the random array's element density is tapered.
Figure 5:
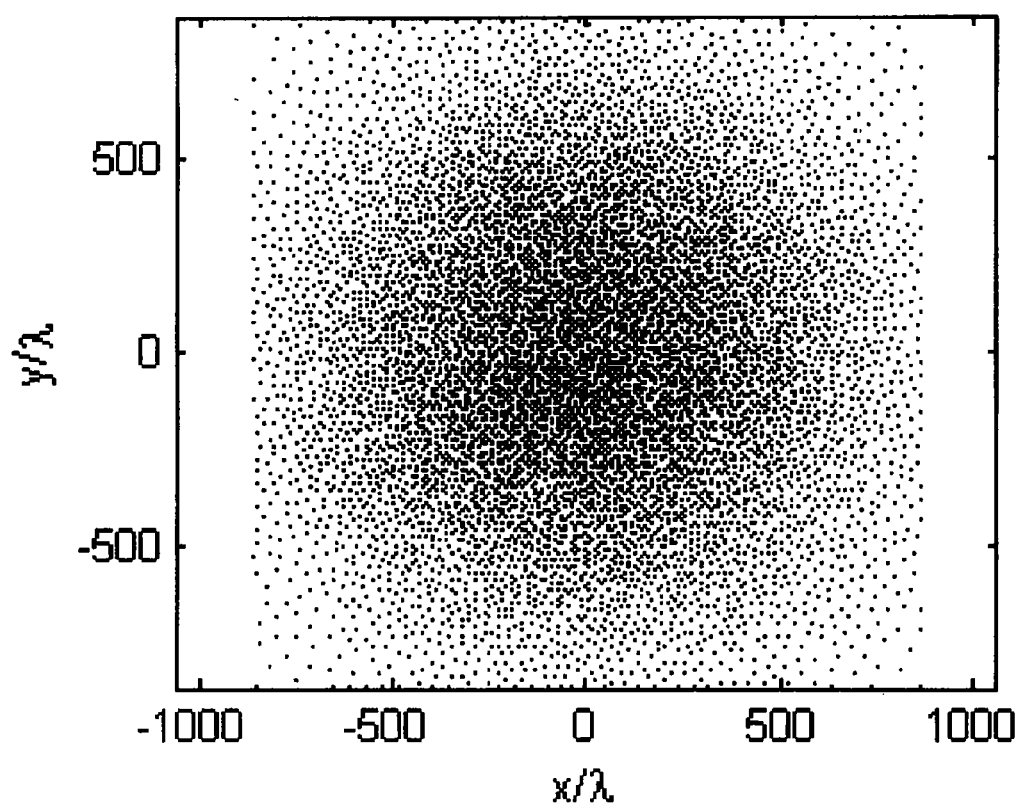
FIG. 5 depicts a random distribution of the elements of an 8000-element OPA with a minimum spacing of 10 μm to eliminate grating lobes.

FIG. 4 shows the simulated beam pattern of a 8000-element pseudo-random array with a minimum spacing of 10 µm at a wavelength of 1.1 µm compared to a uniform array with the same number of elements. FIG. 3 shows a random distribution of the array elements resulting in the beam pattern shown in FIG. 2. Due to the elimination of grating lobes, a single aperture (one tile) can be used to realize a device with high FOV (>45°) by placing a diverging microlens array above the emitting facets. This approach maintains large enough aperture for the emitting facets for high output power, and yet allows high FOV scanning through the diverging microlenses.

Figure 6:
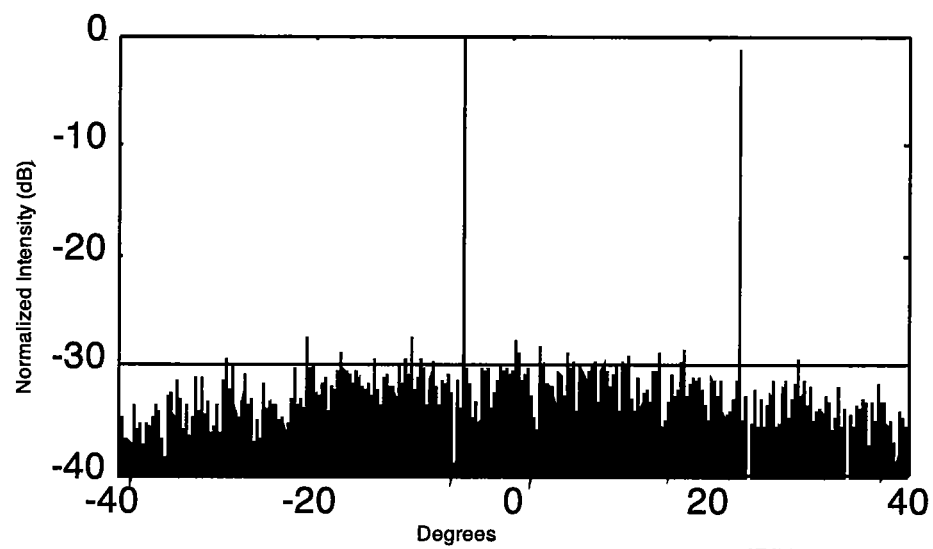
FIG. 6 shows the computed pattern of two simultaneous scanned beams for a random 8000-element optical phased array, one beam at −5° and the other beam at +22.5°.

Multiple beams are achieved through the phase and amplitude control of the individual array elements. FIG. 6 shows the computed pattern of two simultaneous scanned beams, one at −5° and the other at +22.5°, using the same pseudo-random V-OPA described above. This method is capable of creating more than four independent beams, and with tight amplitude control, the side lobes of the p-random array are not degraded by the addition of multiple beams.

One of the main aspects of an optical phased array is the realization of a coherent array of 2-D emitters. The present approach involves injection locking of a VCSEL array via 2-D coherent beamlets emanating from one master laser resulting in a solidly phase locked array, independent of its size. To obtain a full 0-2π phase tuning of each VCSEL in the array, the V-OPA utilizes an array of vertical cavity Fabry-Perot (F-P) multiple-quantum-well (MQW) phase modulator (VCMOD) in the path of the injection locking beamlets. The effective phase change, $\Delta\phi_M$, in a transmissive VCMOD array is given by $$\Delta\phi_M = \Delta\phi_r \times F = \frac{4\pi\Delta n L_C}{\lambda} \frac{\pi\sqrt{R}}{1-R},$$

where, $\Delta\phi_r$ is the single-pass roundtrip phase shift in the cavity with finesse F, $\Delta n$ is the carrier-induced index change in the MQW, $L_C$ is the F-P cavity length, and R is the effective reflectivity of the cavity mirrors. For $\Delta n=5\times10^{-3}$, $L_C=\sim1$ µm, a cavity finesse of about 100 is required for an effective phase change of $\Delta\phi_M=2\pi$. This finesse value can be achieved with cavity mirror reflectivities of about 97%. The minimum optical transmission of the above VCMOD structure is about 0.2 obtained at a maximum phase change of 2π. Variations in the intensity of the injection signal by a factor of 5 results in a change of a factor of about 2.2 in the frequency locking range of the slave lasers. For example, for a typical optical injection ratio of $2\times10^{-4}$ at maximum VCMOD transmission, the VCSEL locking bandwidth is calculated to decrease from 7.4 GHz to 3.4 GHz when the optical phase is modulated from 0 to 2π. Stable injection locking can be achieved within this range of locking bandwidth, for example by using a 600 mW master laser to feed 8000 emitting elements in the V-OPA.

Phase errors affect the array gain, side-lobe level, and beam position. Sources of phase error include quantization errors, random errors, and errors due to phase drifts. Phase shifters with more than 5-bit control result in quantization-induced side-lobe levels of less than 30 dB. Also, the beam pointing error due to the quantization phase error is less than 0.03 beamwidths (0.001°), and hence negligible. Once a V-OPA is fabricated, the relative phase differences due to fabrication variations need to be calibrated and stored in a lookup table for proper phased array operation. This calibration procedure can be performed using a scanning fiber optic-based interferometer. During field operation, the phase control voltages may drift away from the lookup table due to localized temperature variations, element aging, or other unknown factors. To this end, a chip-scale SOI-based interferometer is integrated with the V-OPA, as shown in FIG. 1. A small grating located above each element facet taps off a fraction (<10%) of the radiated optical signal and couples it into a silicon wire waveguide. Silicon wires from each pair of elements are combined and fed into a monolithic germanium detector that is located at half the optical distance between elements. Starting from a reference element, the currents from each pair of elements are monitored by a processor that in turn supplies the phase control voltages in real-time back to each element, thus completing the loop.

The optical efficiency of the V-OPA, determined by the loss between the optical source (VCSELs) and the emitting surface (phase control layer), is quite high (>75%) due to the small tap-off by the grating coupler (<10%) and the low insertion loss of the microlens array (<0.5 dB).

The electrical power dissipation of the V-OPA, other than that of the VCSEL emitters, is mainly determined by the phase control circuitry. We estimate a power dissipation of <25 mW per facet for the 8000 element V-OPA, which includes the master laser and the control circuitry.

The V-OPA is a scalable device since it is based on the vertical integration of 2-D arrays of different functional layers with the same lateral geometry. These layers can be coupled via wafer/chip bonding techniques, such as direct contact bonding or thermal compression bonding, with a positional accuracy of <1 µm.

The materials of the various substrates and structures mentioned herein may be changed as needed or desired. Obviously, the substrates 110, 120 and 130 should be transparent or nearly transparent to the frequency of master laser 12. So in some embodiments, for example, with emission wavelengths in the range of 1.3 to 3 µm, other materials, such as InP, may be selected therefor and for the waveguides 17 and 26 mentioned herein. The photosensitive material of the photodetectors 28I and 28Q may be modified as needed.

It should be understood that the above-described embodiments are merely some possible examples of implementations of the presently disclosed invention, set forth for a clearer understanding of the principles of this disclosure. Many variations and modifications may be made to the above-described embodiments of the invention without departing substantially from the principles of the invention. All such modifications and variations are intended to be included herein within the scope of this disclosure and the present invention and protected by the following claims.

What is claimed is:

1. A vertically integrated optical phased array comprising:
    an array of a plurality of vertical cavity surface emitting lasers disposed in an arrangement thereof, the plurality of vertical cavity surface emitting lasers having light emitting ports disposed parallel to one another;
    an array of a plurality of vertical cavity phase modulators disposed in the same aperiodic arrangement as the array of the plurality of vertical cavity surface emitting lasers, with individual modulators of said array of a plurality of vertical cavity phase modulators each being disposed in optical alignment with an injection port of a corresponding one of said plurality of vertical cavity surface emitting lasers;

a master laser;

an array of a plurality of gratings optically coupled to the master laser, the plurality of gratings being disposed in the same arrangement as the array of the plurality of vertical cavity phase modulators, and each grating of the plurality of gratings optically aligned with a corresponding one of said plurality of vertical cavity phase modulators; and an array of grating taps disposed in the same arrangement as the array of the plurality of vertical cavity surface emitting lasers, the grating taps being coupled to IQ interferometers for adjusting phase changes imposed by said plurality of vertical cavity phase modulators.

2. The vertically integrated optical phased array of claim 1 wherein each said IQ interferometer comprises a pair of photodetectors.

3. The vertically integrated optical phased array of claim 2 wherein the grating taps are coupled to said IQ interferometers by means of waveguides, each waveguide having an optical splitter therein for splitting light in the waveguide into two portions, a first portion being directed to a first one of said photodetectors comprising an IQ interferometer and a second portion being directed a second one of said photodetectors comprising an IQ interferometer, the first one of the photodetectors comprising an IQ interferometer receiving, in use, light in the waveguide with a 90° phase difference compared to the second one of the photodetectors comprising an IQ interferometer.

4. The vertically integrated optical phased array of claim 3 wherein the grating taps, the IQ interferometers, and the waveguides are disposed on or in a common substrate.

5. The vertically integrated optical phased array of claim 4 wherein the common substrate also supports a plurality optical lenses disposed in the same arrangement as the array of the plurality of vertical cavity surface emitting lasers.

6. The vertically integrated optical phased array of claim 5 wherein the grating taps are disposed within a field of view of a corresponding lens.

7. The vertically integrated optical phased array of claim 1 wherein the master laser and the array of the plurality of gratings are disposed on a common substrate, the master laser feeding light to a slab waveguide region via at least one adiabatic taper and the plurality of gratings on said slab waveguide region.

8. The vertically integrated optical phased array of claim 1 wherein said arrangement comprises a bounded random arrangement, having a lower bound is constrained by a physical size of a larger of the vertical cavity surface emitting lasers and vertical cavity phase modulators and having an a upper bound constrained by a physical size of the vertically integrated optical phased array.

9. The vertically integrated optical phased array of claim 1 wherein the plurality of vertical cavity surface emitting lasers, the plurality of vertical cavity phase modulators, and the plurality of gratings are disposed in an aperiodic arrangement.

10. The vertically integrated optical phased array of claim 1 wherein the plurality of vertical cavity surface emitting lasers, the plurality of vertical cavity phase modulators, and the plurality of gratings are disposed in a two dimensional (2D) arrangement.

11. The vertically integrated optical phased array of claim 1 wherein the plurality of vertical cavity surface emitting lasers, the plurality of vertical cavity phase modulators, and the plurality of gratings are disposed in an aperiodic two dimensional (2D) arrangement.

12. The vertically integrated optical phased array of claim 1 wherein: the array of the plurality of vertical cavity surface emitting lasers, the array of the plurality of vertical cavity phase modulators, the master laser, the plurality of gratings, and the array of grating taps are bonded together to form an integrated structure.

13. The vertically integrated optical phased array of claim 12 wherein the integrated structure has a thickness of 1 millimeter (mm) or less.

14. The vertically integrated optical phased array of claim 12 wherein the integrated structure has a volume of less than 0.1 cm$^3$.

15. A method of forming an optical phased array comprising:

providing a plurality of vertical cavity surface emitting lasers;

providing a plurality of vertical cavity phase modulators, with individual modulators of said plurality of vertical cavity phase modulators each being disposed in optical alignment with an injection port of a corresponding one of said plurality of vertical cavity surface emitting lasers;

providing a master laser;

providing a plurality of gratings optically coupled to the master laser, the plurality of gratings being disposed in the same arrangement as the array of the plurality of vertical cavity phase modulators, and each grating of the plurality of gratings optically aligned with a corresponding one of said plurality of vertical cavity phase modulators; and providing an array of grating taps disposed in the same arrangement as the array of the plurality of vertical cavity surface emitting lasers, the grating taps being coupled to IQ interferometers for adjusting phase changes imposed by said plurality of vertical cavity phase modulators.

16. The method of claim 15 wherein each said IQ interferometer includes a pair of photodetectors.

17. The method of claim 16 further including coupling the grating taps to said IQ interferometers by means of waveguides, each waveguide having an optical splitter therein for splitting light in the waveguide into two portions, a first portion being directed to a first one of said photodetectors comprising an IQ interferometer and a second portion being directed a second one of said photodetectors comprising an IQ interferometer, the first one of the photodetectors comprising an IQ interferometer receiving light in the waveguide with a 90° phase difference compared to the second one of the photodetectors comprising an IQ interferometer.

18. The method of claim 17 further including disposing the grating taps, the IQ interferometers, and the waveguides on or in a common substrate.

19. The method of claim 18 wherein the common substrate also supports a plurality optical lenses disposed in the same arrangement as the array of the plurality of vertical cavity surface emitting lasers.

20. The method of claim 19 further including disposing the grating taps within a field of view of a corresponding lens.

21. The method of claim 15 further including disposing the a plurality of gratings and the master laser on a common substrate, the master laser feeding light to a slab waveguide region via at least one adiabatic taper, the plurality of gratings formed on said slab waveguide region.

22. The method of claim 15 wherein said aperiodic arrangement comprises a bounded random arrangement, having a lower bound is constrained by a physical size of a larger of the vertical cavity surface emitting lasers and vertical cavity phase modulators and having an a upper bound constrained by a physical size of the vertically integrated optical phased array.

23. The method of claim 15 wherein the plurality of vertical cavity surface emitting lasers, the plurality of vertical cavity phase modulators, and the plurality of gratings are disposed in an aperiodic arrangement.

24. The method of claim 15 wherein the plurality of vertical cavity surface emitting lasers, the plurality of vertical cavity phase modulators, and the plurality of gratings are disposed in a two dimensional (2D) arrangement.

25. The method of claim 15 wherein the plurality of vertical cavity surface emitting lasers, the plurality of vertical cavity phase modulators, and the plurality of gratings are disposed in an aperiodic two dimensional (2D) arrangement.

26. The method of claim 15 further comprising: bonding the array of the plurality of vertical cavity surface emitting lasers, the array of the plurality of vertical cavity phase modulators, the master laser, the plurality of gratings, and the array of grating taps together to form an integrated structure.

27. The method of claim 26 wherein the integrated structure has a thickness of 1 millimeter (mm) or less.

28. The method of claim 26 wherein the integrated structure has a volume of less than $0.1$ cm$^3$.

* * * * *